(12) United States Patent
Kim et al.

(10) Patent No.: US 6,596,459 B1
(45) Date of Patent: Jul. 22, 2003

(54) PHOTOSENSITIVE POLYMER AND RESIST COMPOSITION CONTAINING THE SAME

(75) Inventors: Hyun-woo Kim, Sungnam (KR); Ki-young Kwon, Seoul (KR); Si-hyeung Lee, Suwon (KR); Dong-won Jung, Yongin (KR); Sook Lee, Seoul (KR); Kwang-sub Yoon, Seoul (KR); Sang-jun Choi, Seoul (KR); Sang-gyun Woo, Paldal-gu (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/716,269

(22) Filed: Nov. 21, 2000

(30) Foreign Application Priority Data

Dec. 8, 1999 (KR) .............................. 99-55837

(51) Int. Cl.$^7$ .............................. G03F 7/004
(52) U.S. Cl. .................... 430/270.1; 430/322; 526/281; 526/282
(58) Field of Search .............. 430/270.1, 322; 526/272, 281; 560/116, 120

(56) References Cited

U.S. PATENT DOCUMENTS

| | | | |
|---|---|---|---|
| 5,876,900 A | * | 3/1999 | Watanabe et al. ......... 430/288.1 |
| 6,147,249 A | * | 11/2000 | Watanabe et al. ........... 560/120 |
| 6,177,228 B1 | * | 1/2001 | Allen et al. ............... 430/270.1 |
| 6,284,429 B1 | * | 9/2001 | Kinsho et al. ........... 430/270.1 |
| 6,291,131 B1 | * | 9/2001 | Jung et al. ................ 430/270.1 |
| 6,503,687 B2 | * | 1/2003 | Kim et al. ................ 430/270.1 |
| 2001/0003772 A1 | * | 6/2001 | Hatakeyama et al. ....... 526/279 |
| 2001/0018162 A1 | * | 8/2001 | Hatakeyama et al. .... 430/270.1 |
| 2001/0033989 A1 | * | 10/2001 | Harada et al. ........... 430/270.1 |
| 2001/0038969 A1 | * | 11/2001 | Hatakeyama et al. .... 430/270.1 |
| 2002/0049287 A1 | * | 4/2002 | Roh et al. .................... 526/160 |

FOREIGN PATENT DOCUMENTS

WO  WO-9942510  *  8/1999  ........... C08G/61/08

* cited by examiner

*Primary Examiner*—Janet Baxter
*Assistant Examiner*—Yvette C. Thornton
(74) *Attorney, Agent, or Firm*—Volentine Francos, PLLC

(57) ABSTRACT

There are provided a photosensitive polymer and a photoresist compositing containing the same. The photosensitive polymer is represented by the following formula:

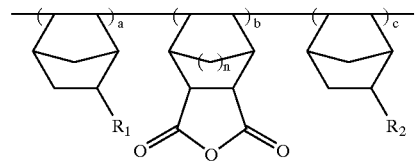

wherein $R_1$ is an acid-labile tertiary alkyl ester group, $R_2$ is hydrogen atom, methyl, ethyl, carboxyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester or $C_3$ to $C_{20}$ alicyclic hydrocarbon, $a/(a+b+c)$ is 0.1~0.7, $b/(a+b+c)$ is 0.1~0.8, $c/(a+b+c)$ is 0.0~0.8, and n is an integer in the range of 0 to 2.

16 Claims, No Drawings

PHOTOSENSITIVE POLYMER AND RESIST COMPOSITION CONTAINING THE SAME

BACKGROUND OF THE INVENTION

1. Field of the Invention

The present invention relates to a photosensitive polymer and a resist composition containing the same, and more particularly, to a photosensitive polymer having a main chain consisting of only norbornene-type alicyclic units, and a resist composition containing the same.

2. Description of the Related Art

As semiconductor devices become highly integrated, fine pattern formation is required in a photolithography process. Further, a pattern size having a design rule of less than 0.2 µm is required for devices beyond 1 giga capacity. Accordingly, there are limitations in using a conventional resist material with a KrF excimer laser (248 nm). Thus, a new resist material capable of being developed using an ArF excimer laser (193 nm) has been developed in a lithography process.

The resist material used in the lithography process using the ArF excimer laser has several problems in being commercially used, compared to the conventional resist materials. The most typical problems are transmittance of a polymer and resistance to dry etching.

As the widely known ArF resist materials, (meth)acrylate polymers are generally used. In particular, the most typical resist material is poly(methyl methacrylate-tert-butyl methacrylate-methacrylic acid) terpolymer system manufactured by IBM, Inc. However, such polymers have very weak resistance to dry etching.

Accordingly, to increase the resistance to dry etching, a polymer having a backbone composed of an alicyclic compound such as an isobornyl group, an adamantyl group or a tricyclodecanyl group, is used. However, the resulting resist still exhibits weak resistance to dry etching.

Alternatively, in order to increase the resistance to dry etching, norbornene-type polymers having a main chain consisting of alicyclic units are used. The norbornene-type polymers are known to be incapable of radical polymerization by themselves. In this context, norbornene-type polymers have been prepared by alternating copolymerization with maleic anhydride. However, due to the introduction of maleic anhydride, the resistance to dry etching is lowered and the stability over time is poor, shortening the shelflife of the polymer.

Accordingly, attempts to attain copolymers having a main chain consisting of only norbornene-type units have been tried using addition polymerization using a metallic catalyst such as palladium (see Joice P. Mathew et al., Macromolecules, 1996, 29(8), p 2755.). However, it is difficult to completely remove the metallic catalyst used for polymerization. Thus, in the case of using a resist composition obtained from the polymer, metallic components may remain on a wafer. These remaining metallic components impede the use of the resist in manufacturing an electronic apparatus such as a semiconductor device.

SUMMARY OF THE INVENTION

The present invention is therefore directed to photosensitive polymer which substantially overcomes one or more of the problems due to the limitations and disadvantages of the related art.

It is an object of the present invention to provide a photosensitive polymer having a main chain consisting of only norbornene-type units so that sufficient resistance to dry etching can be attained.

It is another object of the present invention to provide a resist composition which contains the photosensitive polymer, which avoids metallic components remaining on a wafer, and which provides for excellent lithographic performance during a lithography process using an ArF excimer laser.

Accordingly, to achieve the above objective, there is provided a photosensitive polymer represented by the following formula:

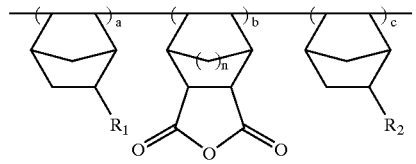

wherein $R_1$ is an acid-labile tertiary alkyl ester group, $R_2$ is hydrogen atom, methyl, ethyl, carboxyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester or $C_3$ to $C_{20}$ alicyclic hydrocarbon, a/(a+b+c) is 0.1~0.7, b/(a+b+c) is 0.1~0.8, c/(a+b+c) is 0.0~0.8, and n is an integer in the range of 0 to 2.

Preferably, the photosensitive polymer has a weight-average molecular weight of 1,000~100,000. Also, $R_1$ is preferably a substituted or unsubstituted $C_7$ to $C_{20}$ alicyclic hydrocarbon compound. More preferably, $R_1$ is 2-methyl-2-norbornyl ester, 2-ethyl-2-norbornyl ester, 2-methyl-2-isobornyl ester, 2-ethyl-2-isobornyl ester, 8-methyl-8-tricyclo[5.2.1.0$^{2.6}$]decyl ester, 8-ethyl-8-tricyclo[5.2.1.0$^{2.6}$] decyl ester, 2-methyl-2-adamantyl ester, 2-ethyl-2-adamantyl ester or 1-adamantyl-1-methylethyl ester.

According to another aspect of the present invention, there is provided a resist composition comprising (a) a photosensitive polymer represented by the following formula:

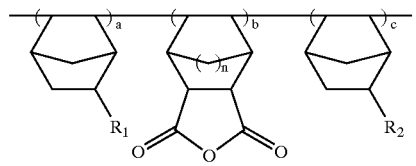

wherein $R_1$ is an acid-labile tertiary alkyl ester group, $R_2$ is hydrogen atom, methyl, ethyl, carboxyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester or $C_3$ to $C_{20}$ alicyclic hydrocarbon, a/(a+b+c) is 0.1~0.7, b/(a+b+c) is 0.1~0.8, c/(a+b+c) is 0.0~0.8, and n is an integer in the range of 0 to 2, and (b) a photoacid generator (PAG).

Preferably, the resists composition includes the PAG in an amount of 1 to 15% by weight based on the total weight of the polymer.

Examples of the PAG include triarylsulfonium salts, diaryliodonium salts, sulfonates or mixtures thereof. Preferably, the PAG is triphenylsulfonium triflate, triphenylsulfonium antimonate, diphenyliodonium triflate, diphenyliodonium antimonate, methoxydiphenyliodonium triflate, di-t-butyl diphenyliodonium triflate, 2,6-dinitrobenzyl sulfonates, pyrogallol tris(alkylsulfonates), N-hydroxysuccinimide triflate, norbornene-dicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide nonaflate, triphenylsulfonium perfluorooctanesulfonate (PFOS), diphenyliodonium PFOS, methoxy diphenyliodonium PFOS, di-t-butyl diphenyliodonium triflate, N-hydroxysuccinimide PFOS, norbornene-dicarboximide PFOS, or a mixture thereof.

The resist composition of the present invention may further include an organic base. Preferably, the resist composition includes the organic base in an amount of 0.01 to 2.0% by weight based on the total weight of the polymer. Usable organic bases include triethylamine, triisobutylamine, triisooctylamine, diethanolamine, triethanolamine or a mixture thereof. Also, the resist composition of the present invention may further include a surfactant, preferably in an amount of 30 to 200 ppm.

The photosensitive polymer according to the present invention has a main chain consisting of only norbornene-type units so that sufficient resistance to dry etching can be attained. The photosensitive polymer having such a structure can be prepared with a high yield without using a metallic catalyst. Also, the resist composition obtained from the polymer exhibits excellent adhesion.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

A photosensitive polymer according to the present invention is represented by the following formula (1):

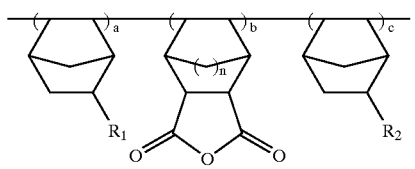

[Formula (1)]

wherein $R_1$ is a group which can be deprotected from the main chain of the polymer by the action of acid generated during exposure, serves to enhance the resistance to dry etching and serves as a dissolution inhibitor. $R_1$ is a bulky tertiary alkyl ester group having a substituted or unsubstituted $C_7$ to $C_{20}$ alicyclic hydrocarbon compound, and examples thereof include 2-methyl-2-norbornyl ester, 2-ethyl-2-norbornyl ester, 2-methyl-2-isobornyl ester, 2-ethyl-2-isobornyl ester, 8-methyl-8-tricyclo[5.2.1.0$^{2.6}$] decyl ester, 8-ethyl-8-tricyclo[5.2.1.0$^{2.6}$]decyl ester, 2-methyl-2-adamantyl ester, 2-ethyl-2-adamantyl ester and 1-adamantyl-1-methylethyl ester.

$R_2$ is a polar group induced as an adhesion promoter for improving adhesion characteristics in the polymer, and examples thereof include hydrogen atom, methyl, ethyl, carboxyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester and $C_3$ to $C_{20}$ alicyclic hydrocarbon.

The anhydride represented in the unit of a second monomer in Formula (1) increases the dry etching resistance of the photosensitive polymer, improves wettability and serves as an adhesion promoter.

In Formula (1), a/(a+b+c) is 0.1~0.7, b/(a+b+c) is 0.1~0.8, c/(a+b+c) is 0.0~0.8 n is an integer in the range of 0 to 2.

The photosensitive polymer represented by Formula (1) has all characteristics necessary for serving as a resist for deep UV. Copolymerization of the photosensitive polymers cannot be achieved by conventional radical polymerization or addition polymerization using a metallic catalyst. Even though polymerization is achieved, the molecular weight of the obtained polymer is very low, that is, about several hundreds, and the yield is very low.

Polymerization methods of a photosensitive polymer according to preferred embodiments of the present invention will now be described in detail.

EXAMPLE 1

Synthesis of Copolymer

Various synthesis examples of copolymers represented by the Formula (2) will now be described.

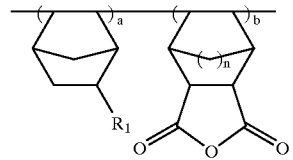

[Formula (2)]

Example 1-1

In Formula (2), in the case where $R_1$ is 8-methyl-8-tricyclo[5.2.1.0$^{2.6}$]decyl ester and n=1, a copolymer is synthesized in the following manner.

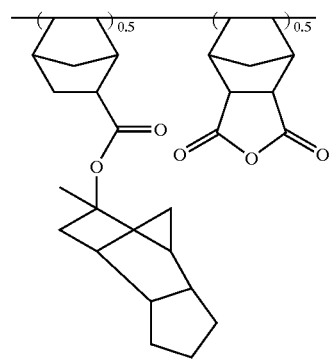

1.64 g of 5-norbornene-2,3-dicarboxylic anhydride (0.01 mol) and 2.86 g of 8-methyl-8-tricyclo[5.21.0$^{2.6}$]decyl-5-norbornene-2-carboxylate (MTCDNC) (0.01 mol) were dissolved in 4.5 g of propylene glycol monomethyl ether acetate (PGMEA) and then 2.92 g of di-t-butyl peroxide was added thereto. Then, the reactant was degassed for about two hours and then purged using nitrogen gas.

The reactant solution was polymerized at a temperature of about 130° C. for about twelve hours and then diluted using tetrahydrofuran (THF). Thereafter, the product was precipitated in an excess co-solvent, a mixture of n-hexane and ether in a volumetric ratio of 10 to 1. Thereafter, the product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 8,000 and 1.9, respectively.

Example 1-2

In Formula (2), in the case where $R_1$ is 8-ethyl-8-tricyclo[5.2.1.0$^{2.6}$]decyl ester and n=1, a copolymer is synthesized in the following manner.

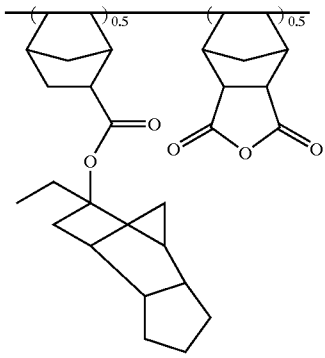

1.64 g of 5-norbornene-2,3-dicarboxylic anhydride (0.01 mol) and 3.00 g of 8-ethyl-8-tricyclo[5.2.1.0$^{2.6}$]decyl-5-norbornene-2-carboxylate (ETCDNC) (0.01 mol) were dissolved in 3 g of PGMEA and then 2.92 g of di-t-butyl peroxide was added thereto. Then, the reactant was degassed for about two hours and then purged using nitrogen gas.

The reactant solution was polymerized at a temperature of about 125° C. for about twelve hours and then diluted using THF. Thereafter, the product was precipitated in an excess co-solvent which is a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 97%).

The weight-average molecular weight (Mw) and polydispersity of the obtained product were 10,000 and 2.1, respectively.

Example 1-3

In Formula (2), in the case where $R_1$ is 2-methyl-2-adamantyl ester and n=1, a copolymer is synthesized in the following manner.

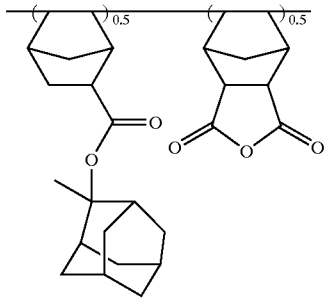

1.64 g of 5-norbornene-2,3-dicarboxylic anhydride (0.01 mol) and 2.86 g of (2-methyl-2-adamantyl)-5-norbornene-2-carboxylate (MAdNC) (0.01 mol) were dissolved in 3 g of PGMEA and then 2.92 g of di-t-butyl peroxide was added thereto. Then, the reactant was degassed for about two hours and then purged using nitrogen gas.

The reactant solution was polymerized at a temperature of about 135° C. for about 12 hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 8,500 and 1.7, respectively.

Example 1-4

In Formula (2), in the case where $R_1$ is 2-ethyl-2-adamantyl ester and n=1, a copolymer is synthesized in the following manner.

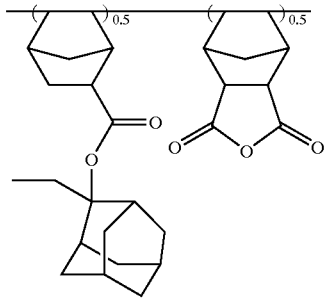

1.64 g of 5-norbornene-2,3-dicarboxylic anhydride (0.01 mol) and 3.00 g of (2-ethyl-2-adamantyl)-5-norbornene-2-carboxylate (EAdNC) (0.01 mol) were dissolved in 3 g of PGMEA and then 1.5 g of di-t-butyl peroxide was added thereto. Then, the reactant was degassed for about two hours and then purged using nitrogen gas.

The reactant solution was polymerized at a temperature of about 125° C. for about 20 hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 8,700 and 1.67, respectively.

Example 1-5

In Formula (2), in the case where $R_1$ is 1-adamantyl-1-methylethyl ester and n=1, a copolymer is synthesized in the following manner.

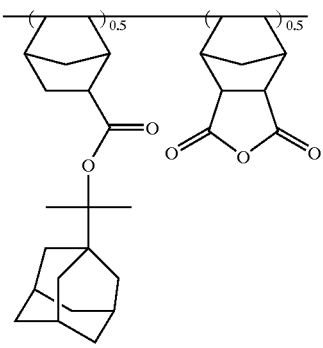

1.64 g of 5-norbornene-2,3-dicarboxylic anhydride (0.01 mol) and 3.14 g of (1-adamantyl-1-methylethyl)-5-norbornene-2-carboxylate (AdMENC) (0.01 mol) were dissolved in 3 g of PGMEA and then 2.0 g of di-t-butyl peroxide was added thereto. Then, the reactant was degassed for about two hours and then purged using nitrogen gas.

The reactant solution was polymerized at a temperature of about 125° C. for about twenty hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 6,700 and 1.68, respectively.

Example 1-6

In Formula (2), in the case where $R_1$ is 2-methyl-2-norbornyl ester and n=1, a copolymer is synthesized in the following manner.

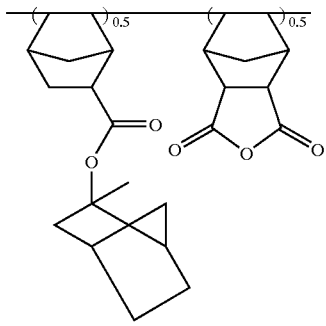

1.64 g of 5-norbornene-2,3-dicarboxylic anhydride (0.01 mol) and 2.46 g of (2-methyl-2-norbornyl)-5-norbornene-2-carboxylate (MNNC) (0.01 mol) were dissolved in 3 g of PGMEA and then 2.0 g of di-t-butyl peroxide was added thereto. Then, the reactant was degassed for about two hours and then purged using nitrogen gas.

The reactant solution was polymerized at a temperature of about 120° C. for about fifteen hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 96%).

The weight-average molecular weight (Mw) and polydispersity of the obtained product were 6,700 and 1.68, respectively.

Example 1-7

In Formula (2), in the case where $R_1$ is 8-ethyl-8-tricyclo[5.2.1.0$^{2.6}$]decyl ester and n=2, a copolymer is synthesized in the following manner.

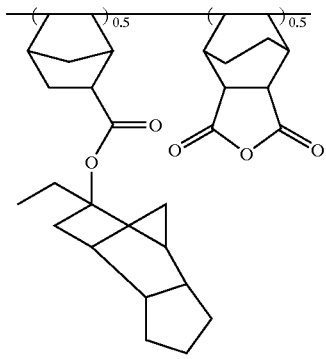

1.78 g of bicyclo[2.2.2]oct-5-ene-2,3-dicarboxylic anhydride (0.01 mol) and 3.0 g of ETCDNC (0.01 mol) were dissolved in 4.5 g of PGMEA and then 2.9 g of di-t-butyl peroxide was added thereto. Then, the reactant was degassed for about two hours and then purged using nitrogen gas.

The reactant solution was polymerized at a temperature of about 130° C. for about twenty hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 11,000 and 1.9, respectively.

As a reactant copolymerized with bicyclo[2.2.2]oct-5-ene-2,3-dicarboxylic anhydride, MTCDNC, MAdNC, EAdNC, AdMENC or MNNC may be used, instead of ETCDNC, to attain various copolymers in the same manner as described above.

Example 1-8

In Formula (2), in the case where $R_1$ is 8-ethyl-8-tricyclo[$5.2.1.0^{2.6}$]decyl ester and n=0, a copolymer is synthesized in the following manner.

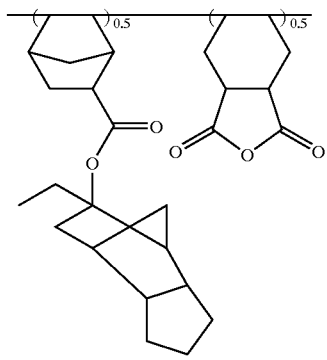

1.52 g of cis-1,2,3,6-tetrahydrophthalic anhydride (0.01 mol) and 3.0 g of ETCDNC (0.01 mol) were dissolved in 4.5 g of PGMEA and then 2.0 g of di-t-butyl peroxide was added thereto. Then, the reactant was degassed for about two hours and then purged using nitrogen gas.

The reactant solution was polymerized at a temperature of about 130° C. for about 20 hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 10,000 and 1.8, respectively.

As a reactant copolymerized with cis-1,2,3,6-tetrahydrophthalic anhydride, MTCDNC, MAdNC, EAdNC, AdMENC or MNNC may be used, instead of ETCDNC, to attain various copolymers in the same manner as described above.

In the Examples 1-1 through 1-8, the composition ratio of the respective monomer units constituting the respective obtained copolymers was 5:5. However, during polymerization, the composition ratio can be desirably adjusted by varying the feed ratio of sources necessary for forming the respective monomer units.

Example 2

Synthesis of Terpolymer

Various synthesis examples of copolymers represented by the Formula (3) will now be described.

[Formula (3)]

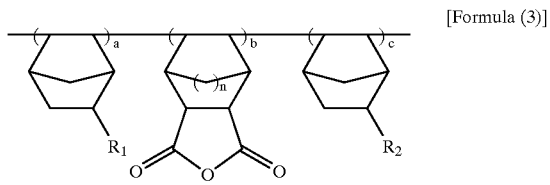

Example 2-1

In Formula (3), in the case where $R_1$ is 8-methyl-8-tricyclo[$5.2.1.0^{2.6}$]decyl ester, n=1 and $R_2$ is carboxylic acid, a copolymer is synthesized in the following manner.

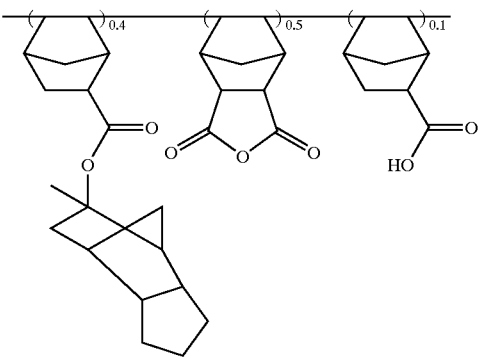

1.31 g of 5-norbornene-2,3-dicarboxylic anhydride (0.008 mol), 2.86 g of 8-methyl-8-tricyclo[$5.2.1.0^{2.6}$]decyl-5-norbornene-2-carboxylate (MTCDNC) (0.01 mol) and 0.28 g of 5-norbornene-2-carboxylic acid (0.002 g) were dissolved in.4.5 g of PGMEA and then 2.92 g of di-t-butyl peroxide was added thereto. Then, the reactant was degassed for about two hours and then purged using nitrogen gas.

The reactant solution was polymerized at a temperature of about 130° C. for about twelve hours and then diluted using THF. Thereafter, the product was precipitated in an excess co-solvent, a mixture of n-hexane and ether in a volumetric ratio of 10 to 1.

The product was extracted using a glass filter, dissolved again in THF and then reprecipitated in the co-solvent. These processing steps were repeated three times. The obtained precipitate was dried in a vacuum oven maintained at about 60° C. for over 24 hours, to then separate a desired product (yield: 95%).

The weight-average molecular weight (Mw) and polydispersity of the obtained product were 5,600 and 1.6, respectively.

Example 2-2

In Formula (3), in the case where $R_1$ is 8-ethyl-8-tricyclo[5.2.1.0$^{2.6}$]decyl ester, n=2, and $R_2$ is carboxylic acid, a copolymer is synthesized in the following manner.

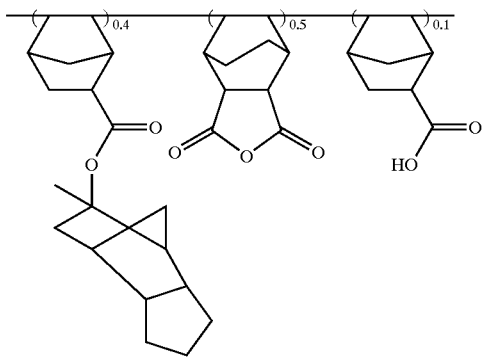

Using bicyclo[2.2.2]oct-5-ene-2,3-dicarboxylic anhydride instead of 5-norbornene-2,3-dicarboxylic anhydride, a desired terpolymer was obtained in the same manner as in Example 2-1 (yield: 80%).

The weight-average molecular weight (Mw) and polydispersity of the obtained product were 6,700 and 1.6, respectively.

Example 2-3

In Formula (3), in the case where $R_1$ is 8-methyl-8-tricyclo[5.2. .0$^{2.6}$]decyl ester, n=0, and $R_2$ is carboxylic acid, a copolymer is synthesized in the following manner.

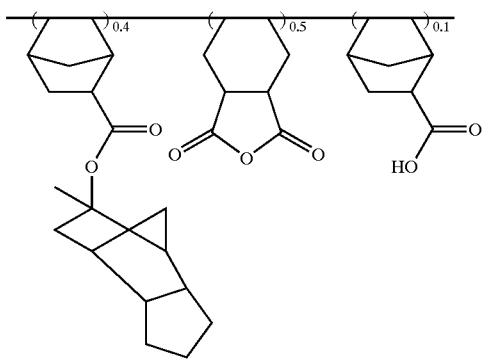

Using cis-1,2,3,6-tetrahydrophthalic anhydride instead of 5-norbornene-2,3-dicarboxylic anhydride, a desired terpolymer was obtained in the same manner as in Example 2-1 (yield: 85%).

The weight-average molecular weight (Mw) and polydispersity of the obtained product were 7,800 and 1.7, respectively.

In the Examples 2-1 through 2-3, the composition ratio of the respective monomer units constituting the respective obtained copolymers was 4:5:1. However, during polymerization, the composition ratio can be desirably adjusted by varying the feed ratio of sources necessary for forming the respective monomer units. Also, by using ETCDNC, MAdNC, EAdNC, AdMENC or MNNC, instead of MTCDNC, various terpolymers can be attained in the same manner as described above.

Example 3

Patterning Process Using Resist Composition

Hereinbelow, the following processes were used for preparing the resist compositions used in a patterning process.

1.0 g of polymer selected from polymers synthesized in Examples 1 and 2, 1 to 15% by weight of a photoacid generator (based on the total weight of the polymer) were dissolved in 7.0 g of PGMEA. Then, if necessary, 0.01 to 2.0% by weight of an organic base made of amine (based on the total weight of the polymer) was added thereto to completely dissolve the reactants.

Examples of PAGs include triarylsulfonium salts, diaryliodonium salts and sulfonates solely or in a mixture of at least two kinds of materials.

Examples of organic bases include triethylamine, triisobutylamine, triisooctylamine, diethanolamine, triethanolamine and mixtures thereof.

Thereafter, the solution was filtered using a 0.2 μm membrane filter to obtain a resist composition.

Then, for a patterning process using the resist composition obtained by the above method, the following processes were used.

A silicon wafer having a silicon oxide film formed thereon was prepared and treated with hexamethyldisilazane (HMDS). Then, the resist composition was coated on the silicon oxide film to a thickness of about 0.4 μm.

The wafer having the resist composition coated thereon was pre-baked at a temperature of 140° C. for 90 seconds and exposed to light using a KrF excimer laser having a numerical aperture of 0.45 or an ArF excimer laser having a numerical aperture of 0.6. Then, post exposure baking (PEB) was performed at a temperature of 10 to 160° C. for 90 seconds.

Thereafter, the resultant was developed using 2.38 wt % of tetramethylammonium hydroxide (TMAH) solution for about 60 seconds. As a result, the silicon oxide film was etched with a predetermined etching gas using the obtained resist pattern as a mask. Subsequently, the resist pattern remaining on the silicon wafer was removed using a stripper to form a desired silicon oxide pattern.

Next, detailed examples of forming patterns using the resist composition prepared in the same method as in Example 3 will be described.

Example 3-1

A resist composition was prepared using 1.0 g of copolymer synthesized in Example 1-4, 0.02 g of triphenylsulfonium triflate as a PAG and 2 mg of triisobutylamine as an organic base were completely dissolved in 7.0 g of PGMEA and then filtered using a 0.2 μm membrane filter to obtain a resist composition. The obtained resist composition was coated on a wafer to a thickness of about 0.4 μm.

Thereafter, the wafer having the resist composition coated thereon was pre-baked at a temperature of 140° C. for 90 seconds and exposed to light using an ArF excimer laser having a numerical aperture of 0.6. Then, post exposure baking (PEB) was performed at a temperature of 140° C. for 90 seconds.

The resultant was developed using 2.38 wt % of TMAH solution for about 60. seconds to form a resist pattern.

When an exposure dose was about 10 mJ/cm$^2$, it was observed that a 0.14 μm line and space pattern was obtained.

Example 3-2

A resist composition was prepared using 1.0 g of copolymer synthesized in Example 1-2, 0.02 g of triphenylsulfonium triflate as a PAG and 2 mg of triisobutylamine as an organic base were completely dissolved in 7.0 g of PGMEA and then filtered using a 0.2 μm membrane filter to obtain a resist composition. The obtained resist composition was coated on a wafer to a thickness of about 0.4 μm.

Thereafter, the wafer having the resist composition coated thereon was pre-baked at a temperature of 140° C. for 90 seconds and exposed to light using an ArF excimer laser having a numerical aperture of 0.6. Then, PEB was performed at a temperature of 150° C. for 90 seconds.

The resultant was developed using 2.38 wt % of TMAH solution for about 60 seconds to form a resist pattern.

When an exposure dose was about 15 mJ/cm², it was observed that a 0.13 μm line and space pattern was obtained.

Example 3-3

A resist composition was prepared using 1.0 g of copolymer synthesized in Example 1-6, 0.02 g of triphenylsulfonirum triflate as a PAG and 2 mg of triisobutylamine as an organic base were completely dissolved in 7.0 g of PGMEA and then filtered using a 0.2 μmembrane filter to obtain a resist composition. The obtained resist composition was coated on a wafer to a thickness of about 0.4 μm.

Thereafter, the wafer having the resist composition coated thereon was pre-baked at a temperature of 140° C. for 90 seconds and exposed to light using an ArF excimer laser having a numerical aperture of 0.6. Then, PEB was performed at a temperature of 160° C. for 90 seconds.

The resultant was developed using 2.38 wt % of TMAH solution for about 60 seconds to form a resist pattern.

When an exposure dose was about 13 mJ/cm², it was observed that a 0.13 μm line and space pattern was obtained.

As described above, according to the present invention, by providing a polymer whose main chain consists of only norbornene-type units which is an alicyclic compound, in order to overcome the drawback of a conventional ArF resist, sufficiently increased dry etching resistance can be obtained.

Also, in the present invention, since the adhesion characteristic of a polymer is enhanced, excellent adhesion to underlaying layers is exhibited. Thus, excellent lithographic performance can be obtained using the resist composition obtained from the polymer, and the resist composition according to the present invention can be useful in the manufacture of next generation semiconductor devices.

Although the present invention has been described in detail through preferred embodiments, the invention is not limited thereto, and various modifications and alterations within the spirit and scope of the invention are possible by those skilled in the art.

What is claimed is:

1. A photosensitive polymer represented by the following formula:

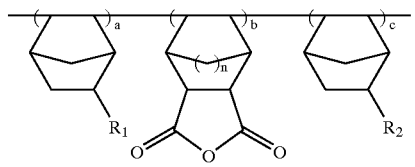

wherein $R_1$ is an acid-labile tertiary alkyl ester group, $R_2$ is hydrogen atom, methyl, ethyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester or $C_3$ to $C_{20}$ alicyclic hydrocarbon, a/(a+b+c) is approximately 0.1–0.7, b/(a+b+c) is 0.1–0.8, c/(a+b+c) is greater than 0 and less than or equal to approximately 0.8, and n is an integer in the range of 0 to 2.

2. The photosensitive polymer according to claim 1, wherein the photosensitive polymer has a weight-average molecular weight of approximately 1,000–100,000.

3. The photosensitive polymer according to claim 1, wherein $R_1$ is a substituted or unsubstituted $C_7$ to $C_{20}$ alicyclic hydrocarbon compound.

4. The photosensitive polymer according to claim 1, wherein $R_1$ is 2-methyl-2-norbornyl ester, 2-ethyl-2-norbornyl ester, 2-methyl-2-isobornyl ester, 2-ethyl-2-isobornyl ester, 8-methyl-8-tricyclo[5.2.1.0$^{2.6}$]decyl ester, 8-ethyl-8-tricyclo[5.2.1.0$^{2.6}$]decyl ester, 2-methyl-2-adamantyl ester, 2-ethyl-2-adamantyl ester or 1-adamantyl-1-methylethyl ester.

5. A resist composition comprising:

(a) a photosensitive polymer represented by the following formula:

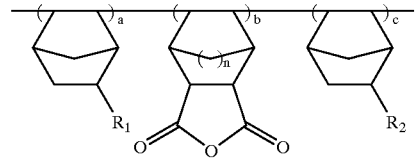

wherein $R_1$ is an acid-labile tertiary alkyl ester group, $R_2$ is hydrogen atom, methyl, ethyl, γ-butyrolactone-2-yl ester, γ-butyrolactone-3-yl ester, pantolactone-2-yl ester, mevalonic lactone ester, 3-tetrahydrofuranyl ester, 2,3-propylenecarbonate-1-yl ester, 3-methyl-γ-butyrolactone-3-yl ester or $C_3$ to $C_{20}$ alicyclic hydrocarbon, a/(a+b+c) is approximately 0.1–0.7, b/(a+b+c) is 0.1–0.8, c/(a+b+c) is greater than 0 and less than or equal to approximately 0.8, and n is an integer in the range of 0 to 2; and (b) a photoacid generator (PAG).

6. The resist composition according to claim 5, wherein the photosensitive polymer has a weight-average molecular weight of approximately 1.000–100,000.

7. The resist composition according to claim 5, wherein $R_1$ is a substituted or unsubstituted $C_7$ to $C_{20}$ alicyclic hydrocarbon compound.

8. The resist composition according to claim 5, wherein $R_1$ is 2-methyl-2-norbornyl ester, 2-ethyl-2-norbornyl ester, 2-methyl-2-isobornyl ester, 2-ethyl-2-isobornyl ester, 8-methyl-8-tricyclo[5.2.1.0$^{2.6}$]decyl ester, 8-ethyl-8-tricyclo[5.2.1.0$^{2.6}$]decyl ester, 2-methyl-2-adamantyl ester, 2-ethyl-2-adamantyl ester or 1-adamantyl-1-methylethyl ester.

9. The resist composition according to claim 5, wherein the PAG is contained in an amount of 1 to 15% by weight based on the total weight of the polymer.

10. The resist composition according to claim 5, wherein the PAG is selected from the group consisting of triarylsulfonium salts, diaryliodonium salts, sulfonates or mixtures thereof.

11. The resist composition according to claim 10, wherein the PAG is triphenylsulfonium triflate, triphenylsulfonium antimonate, diphenyliodonium triflate, diphenyliodonium antimonate, methoxydiphenyliodonium triflate, di-t-butyl diphenyliodonium triflate, 2,6-dinitrobenzyl sulfonates, pyrogallol tris(alkylsulfonates), -hydroxysuccinimide triflate, norbornene-dicarboximide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide nonaflate, triphenylsulfonium perfluorooctanesulfonate (PFOS), diphenyliodonium PFOS, methoxy diphenyliodonium PFOS, di-t-butyl diphenyliodonium triflate, N-hydroxysuccinimide PFOS, norbornene-dicarboximide PFOS, or a mixture thereof.

12. The resist composition according to claim 5, further comprising an organic base.

13. The resist composition according to claim 12, wherein the organic base is contained in an amount of 0.01 to 2.0% by weight based on the total weight of the polymer.

14. The resist composition according to claim 12, wherein the organic base is triethylamine, triisobutylamine, triisooctylamine, diethanolamine, triethanolamine or a mixture thereof.

15. The resist composition according to claim 5, further comprising a surfactant.

16. The resist composition according to claim 15, wherein the surfactant is contained in an amount of 30 to 200 ppm.

* * * * *